United States Patent [19]

Heywang

[11] Patent Number: 4,812,005
[45] Date of Patent: Mar. 14, 1989

[54] ARRANGEMENT FOR COUPLING A LASER DIODE AND A MONOMODE LIGHT WAVEGUIDE HAVING A FEEDBACK MEANS

[75] Inventor: Walter Heywang, Neukeferloh, Fed. Rep. of Germany

[73] Assignee: Siemens Aktiengesellschaft, Berlin and Munich, Fed. Rep. of Germany

[21] Appl. No.: 26,207

[22] Filed: Mar. 16, 1987

Related U.S. Application Data

[63] Continuation-in-part of Ser. No. 910,610, Sep. 23, 1986, abandoned.

[30] Foreign Application Priority Data

Sep. 24, 1985 [DE] Fed. Rep. of Germany ....... 3534016
Sep. 15, 1986 [EP] European Pat. Off. ........ 86112714.0

[51] Int. Cl.$^4$ ................................. G02B 7/26
[52] U.S. Cl. .............................. 350/96.20; 350/96.15; 350/96.17; 350/96.19; 372/6
[58] Field of Search ............... 350/96.10, 96.15, 96.20, 350/96.18, 96.19, 96.17; 250/227; 357/17, 19, 30; 372/6

[56] References Cited

U.S. PATENT DOCUMENTS

| | | | |
|---|---|---|---|
| 3,760,297 | 9/1973 | Thompson | 350/96.15 |
| 3,803,511 | 4/1974 | Thompson | 350/96.15 |
| 4,143,940 | 3/1979 | Khoe | 350/96.15 |
| 4,156,206 | 5/1979 | Comerford et al. | 350/96.15 |
| 4,372,644 | 2/1983 | Unger | 350/96.20 |
| 4,427,261 | 1/1984 | Khoe et al. | 350/96.20 |
| 4,594,718 | 6/1986 | Scifres et al. | 372/45 |
| 4,601,535 | 7/1986 | Tanaka et al. | 350/96.20 |

FOREIGN PATENT DOCUMENTS 2310580 12/1976 France.
55-115008 9/1980 Japan.

OTHER PUBLICATIONS van Oirschot et al, "Ridged Substrate Internally Diffused Stripe AlGaAs Laser Emitting in the Visible Wavelength Region", *Appl. Phys. Lett.*, vol. 43, No. 9, Nov. 1, 1983, pp. 809–811.
Blauvelt et al, "Narrow Stripe AlGaAs Lasers Using Double Current Confinement", *Appl. Phys. Lett.*, vol. 41, No. 10, Nov. 15, 1982, pp. 903–905.
Krupka et al., IEEE J. of Quantum Electronics, vol. QE-11, No. 7, Jul. 1975, "Transverse Mode Control of Junction Lasers Optically Coupled to Single-Mode Fibers", pp. 503–507.

*Primary Examiner*—William L. Sikes
*Assistant Examiner*—Frank González
*Attorney, Agent, or Firm*—Hill, Van Santen, Steadman & Simpson

[57] ABSTRACT

An arrangement for coupling a laser diode and a monomode light waveguide, wherein a fine adjustment is particularly simple. The laser diode is a gain-guided diode having an end face coacting with an end face of the optical waveguide to form a coupling location and the arrangement includes a feedback arrangement for conducting a part of the light coupled from the laser diode into the light waveguide back through the waveguide and back into the laser diode. The feedback means comprises either one or more metallized rings having a width of a few light wavelengths being applied on a cylindrical surface of the monomode glass fiber forming the monomode light waveguide at a distance of a few micrometers from the coupling location, one or more notches in the outer surface of the fiber or combination of rings and notches.

8 Claims, 1 Drawing Sheet

4,812,005

ARRANGEMENT FOR COUPLING A LASER DIODE AND A MONOMODE LIGHT WAVEGUIDE HAVING A FEEDBACK MEANS

CROSS-REFERENCE TO RELATED APPLICATIONS

This application is a continuation in part of my copending application Ser. No. 910,610 filed Sept. 23, 1986 (now abandoned).

BACKGROUND OF THE INVENTION

The present invention is directed to an arrangement for coupling a laser diode and a monomode light waveguide.

When coupling a monomode light waveguide, for example, a monomode optical fiber to a laser diode, a fine adjustment must be undertaken, so that the active light emitting zone of the diode and the light conducting core of the fiber are adjusted precisely relative to one another. Such a fine adjustment is hitherto been mechanically-optically undertaken, for example, with the assistance of a microscope.

SUMMARY OF THE INVENTION

The object of the present invention is to provide an arrangement of a laser diode coupled to a monomode light waveguide, wherein the fine adjustment is particularly simple. To accomplish this, the arrangement of the present invention comprises a gain-guided diode and a feedback means is provided on the optical waveguide at an interval from the coupling location between the waveguide and diode. The feedback means returns a part of the light coupled into the light waveguide back in the waveguide to the diode.

What is achieved by means of the solution is that the part of the light waveguide between the coupling location and the feedback means coacts as part of the optical resonator of the laser. This is a prerequisite for a fine adjustment being able to set itself when the diode and the fiber are adjusted in a rougher adjustment relative to one another. The reason for this is that in a "gain guided" laser, such as disclosed in Appl. Physics Lett., Vol. 43, No. 9, Nov. 1, 1983, pages 809–810, the spatial position of the active light emitting zone within the electrically excited semi-conductor region is defined by the optimum fulfillment of the optical laser condition.

A preferred and advantageous development of the arrangement of the invention is fashioned, wherein the monomode light waveguide is an optical glass fiber on which the feedback means comprises a metallized ring having a width of a few light wavelengths or a plurality of metallized rings which are applied on the glass fiber at a distance of a few micrometers from the coupling location between the end of the fiber and the diode and/or comprises an annular notch or a plurality of annular notches in an outer surface of the optical fiber. The plurality of metallized rings and/or plurality of annular notches thereby is applied in a sense of a distributive feedback, i.e., following one another in the direction of transmission of the light in the waveguide.

DESCRIPTION OF THE PREFERRED EMBODIMENTS

Figure 1:
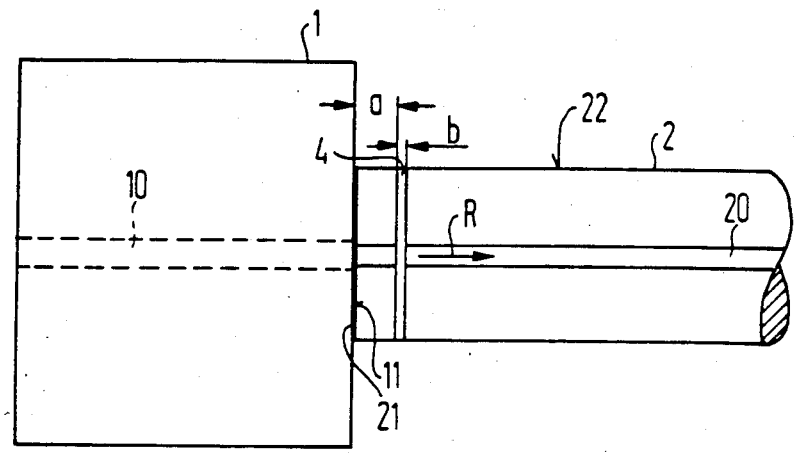
FIG. 1 is a side view of an arrangement for coupling a gain-guided laser diode and a monomode glass fiber in accordance with the present invention.
Figure 2:
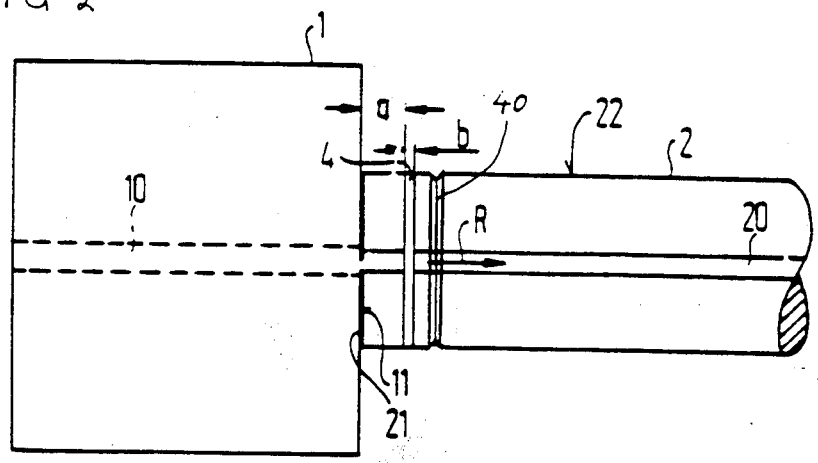
FIG. 2 is a side view of an embodiment of the arrangement of FIG. 1.

The principles of the present invention are particularly useful in a coupling arrangement for a laser diode 1 to a monomode glass fiber 2. The laser diode 1 has an active light emitting zone 10 and an end face 11. The monomode glass fiber 2 has a core 20 and an end face 21. As illustrated, the end face 21 of the monomode fiber 2 lies opposite the end face 11. The coupling occurs essentially only in the region of the core 20 of the fiber 2 in which the light is essentially guided.

A metallization ring 4 having a width b is applied to an outer peripheral surface 22 or circumference surface of the fiber 2 at a distance a from the coupling location defined by the two end faces 11 and 21. The distance a is measured, for example, from the end face 21 of the fiber 2. The distance a can, for example, amount to a few micrometers. The width b can, for example, amount to a few wavelengths of the light being emitted from the diode 1.

The metallized ring 4 provides a feedback means, which conducts a part of the light coupled into the fiber 2 which is essentially conducted in the core 20 and transmitted in the direction R, back through the fiber and into the diode. The initial part of the fiber 2 lying between the end face 21 and the metallized ring 4 thereby acts as part of the optical resonator of the diode 1. The consequence of this is that the active light emitting zone 10 within the electrically excited semi-conductor region automatically finely adjusts to the core 20 of the fiber 2. It needs merely to be seen that the core is brought into a rough adjustment to the electrically excited semi-conductor region 10. Instead of a metallized ring 4 or in addition to the metallized ring 4, one annular notch 40 or a plurality of notches 40 in an outer surface 22 of the optical glass fiber may be provided. The notch 40 may be generated by etching. Each combination of rings and notches is possible.

Although various minor modifications may be suggested by those versed in the art, it should be understood that I wish to employ within the scope of the patent granted hereon, all such modifications as reasonably and properly come within the scope of my contribution to the art.

I claim:

1. An arrangement for coupling a laser diode and a monomode light waveguide, said arrangement comprising a gain-guided laser diode having a coupling surface, a monomode light waveguide being an optical glass fiber having an end face forming a coupling surface engaging the coupling surface of the laser diode to form a coupling location, said waveguide having feedback means at a distance from the coupling location for conducting a part of the light coupled into the light waveguide back in the waveguide to the laser diode, said feedback means comprising at least one metallized ring having a width of a few wavelengths being applied on an outer surface of the glass fiber at a distance of a few micrometers from the end face of the waveguide.

2. An arrangement according to claim 1, wherein the means in addition to at least one metallized ring on the outer surface include at least one annular notch in the outer surface of the optical glass fiber.

3. An arrangement according to claim 1, wherein the means comprises a plurality of metallized rings on the optical glass fiber.

4. An arrangement according to claim 3, wherein the means in addition to a plurality of metallized rings on the outer surface of the optical glass fiber includes a plurality of spaced annular notches in the outer surface of the fiber.

5. An arrangement for coupling a laser diode and a monomode light waveguide, said arrangement comprising a gain-guided laser diode having a coupling surface, a monomode light waveguide being an optical glass fiber having an end face forming a coupling surface engaging the coupling surface of the laser diode to form a coupling location, said waveguide having feedback means at a distance from the coupling location for conducting a part of the light coupled into the light waveguide back in the waveguide to the diode, said feedback means comprising at least one annular notch in an outer surface of the optical glass fiber.

6. An arrangement according to claim 5, wherein said means include at least one metallized ring on the outer surface in addition to said notch.

7. An arrangement according to claim 5, wherein the means comprises a plurality of annular notches in the outer surface of the optical glass fiber.

8. An arrangement according to claim 7, wherein the means comprises a plurality of metallized rings on the outer surface of the optical glass fiber in addition to the plurality of notches.

* * * * *